(12) United States Patent
Hsu et al.

(10) Patent No.: US 8,410,495 B2
(45) Date of Patent: Apr. 2, 2013

(54) ARRAY-TYPE LIGHT-EMITTING DEVICE AND APPARATUS THEREOF

(75) Inventors: Shu-Ting Hsu, Hsinchu (TW); Yen-Wen Chen, Hsinchu (TW); Wei-Yo Chen, Hsinchu (TW); Tsung Xian Lee, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 142 days.

(21) Appl. No.: 12/711,739

(22) Filed: Feb. 24, 2010

(65) Prior Publication Data

US 2010/0213474 A1 Aug. 26, 2010

(30) Foreign Application Priority Data

Feb. 24, 2009 (TW) .............................. 98105908 A

(51) Int. Cl.
*H01L 33/50* (2010.01)
(52) U.S. Cl. ....... 257/89; 257/88; 257/98; 257/E33.061; 313/503
(58) Field of Classification Search .............. 257/88–90, 257/98–100, E33.061; 313/502, 503
See application file for complete search history.

(56) References Cited

U.S. PATENT DOCUMENTS

| | | | | |
|---|---|---|---|---|
| 6,800,999 | B1 * | 10/2004 | Duggal et al. ............. | 315/169.1 |
| 2006/0151793 | A1 * | 7/2006 | Nagai ............................. | 257/79 |
| 2006/0163589 | A1 * | 7/2006 | Fan et al. ......................... | 257/88 |
| 2008/0121780 | A1 | 5/2008 | Ichikawa et al. | |
| 2008/0303039 | A1 * | 12/2008 | Craford et al. .................. | 257/89 |
| 2009/0008655 | A1 | 1/2009 | Peeters et al. | |
| 2009/0108269 | A1 * | 4/2009 | Negley et al. ................... | 257/88 |
| 2010/0096977 | A1 * | 4/2010 | Lee et al. ....................... | 313/503 |
| 2010/0109575 | A1 * | 5/2010 | Ansems et al. ............... | 315/312 |
| 2010/0224890 | A1 * | 9/2010 | Keller et al. .................... | 257/93 |

FOREIGN PATENT DOCUMENTS

| | | |
|---|---|---|
| CN | 101166386 A | 4/2008 |
| CN | 101379341 A | 3/2009 |

* cited by examiner

*Primary Examiner* — Kenneth Parker
*Assistant Examiner* — Yu Chen
(74) *Attorney, Agent, or Firm* — Muncy, Geissler, Olds & Lowe, PLLC

(57) ABSTRACT

The application discloses an array-type light-emitting device comprising a substrate, a semiconductor light-emitting array formed on the substrate and emitting a first light with a first spectrum, wherein the semiconductor light-emitting array comprises a first light-emitting unit and a second light-emitting units, a first wavelength conversion layer formed on the first light-emitting unit for converting the first light into a third light with a third spectrum, and a circuit layer connecting the first light-emitting unit and the second light-emitting unit in a connection form to make the first light-emitting and the second light-emitting unit light alternately in accordance with a predetermined clock when driving by a power supply.

17 Claims, 6 Drawing Sheets

101

ARRAY-TYPE LIGHT-EMITTING DEVICE AND APPARATUS THEREOF

RELATED APPLICATION

This application claims the right of priority based on TW application Ser. No. 098105908 filed on Feb. 24, 2009; the contents of which are incorporated herein by reference in their entirety.

BACKGROUND

1. Technical Field

The present disclosure disclosed an array-type light-emitting device, and a display apparatus which incorporates the preceding array-type light-emitting device.

2. Description of the Related Art

It became feasible to utilize Light Emitting Diode (LED) as a light source in the lighting industry since the blue light LED was presented to the public. White light is the dominant source used for illumination which is generated mainly from two different methods: the first method is to mix lights from red, blue and green LEDs and generating a white light, another well known method is to package a blue light LED together with yellow fluorescent powder.

SUMMARY OF THE DISCLOSURE

The present disclosure is to provide a novel LED chip structure and a display apparatus, which can be used broadly in different light sources.

One aspect of the present disclosure provides a light-emitting device comprising a substrate; a semiconductor light-emitting array insulatively formed on the substrate and emitting a first light beam comprising a first spectrum, wherein the semiconductor light-emitting array comprises a first light-emitting unit and a second light-emitting unit; a first wavelength conversion layer formed on the first light-emitting unit and radiating a second light beam having a second spectrum excited by the first light beam; a second conversion layer is formed on the second light-emitting unit and radiating a third light beam having a third spectrum different from the second spectrum. The first and the second light-emitting units are connected by an electric circuit layer with electric circuit configuration and can be driven by a power source to emit light beams alternatively with a predetermined clock.

Another aspect of the present disclosure is to provide a display apparatus comprising an array-type light-emitting device. The display apparatus with a plurality of pixels comprises a backlight module, a liquid crystal module above the backlight module, a color filter module above the liquid crystal module, and a control module to control the backlight module and the liquid crystal module. The backlight module comprises a light-emitting device as a light source for the display apparatus. The color filter module comprises a plurality of light filter segments corresponding to the plurality of pixels on the display apparatus wherein the plurality of light filter segments comprises a first filter segment to block all light beams except for the first light beam comprising the first spectrum, and a transparent segment which does not function as a filter. An embodiment derived from this aspect includes a first light-emitting unit which emits a first light beam with a first spectrum, a second light-emitting unit which emits a second light beam with a second spectrum, and a electric circuit unit connecting the first light-emitting unit and the second light-emitting unit in a connecting configuration. Therefore the first and the second light-emitting unit emits light beam alternatively with a predetermined clock when the display apparatus is driven by a power source.

BRIEF DESCRIPTION OF DRAWINGS

The accompanying drawings are included to provide easy understanding of the application, and are incorporated herein and constitute as part of this specification. The drawings illustrate embodiments of the application and, together with the description, serve to illustrate the principles of the application.

DETAILED DESCRIPTION OF DISCLOSURE

Figure 1:
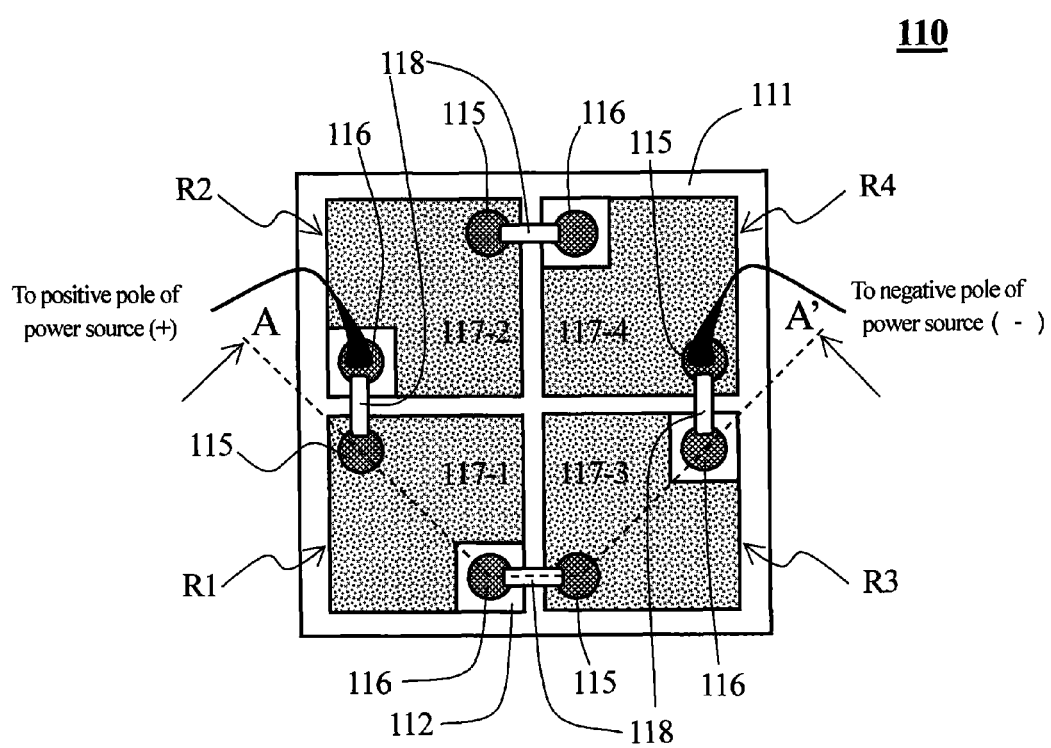
FIG. 1 illustrates the top view of a light-emitting diode chip of the first embodiment in accordance with the present application.
Figure 2:
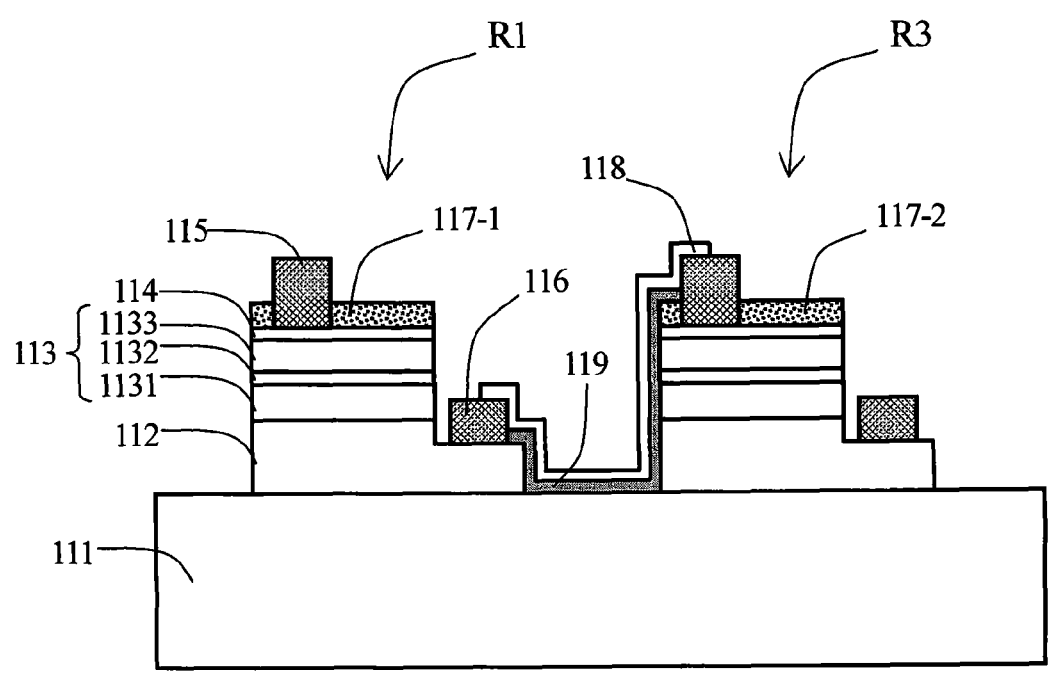
FIG. 2 is a cross section view of a light-emitting diode chip of the first embodiment in accordance with the present application.
Figure 3:
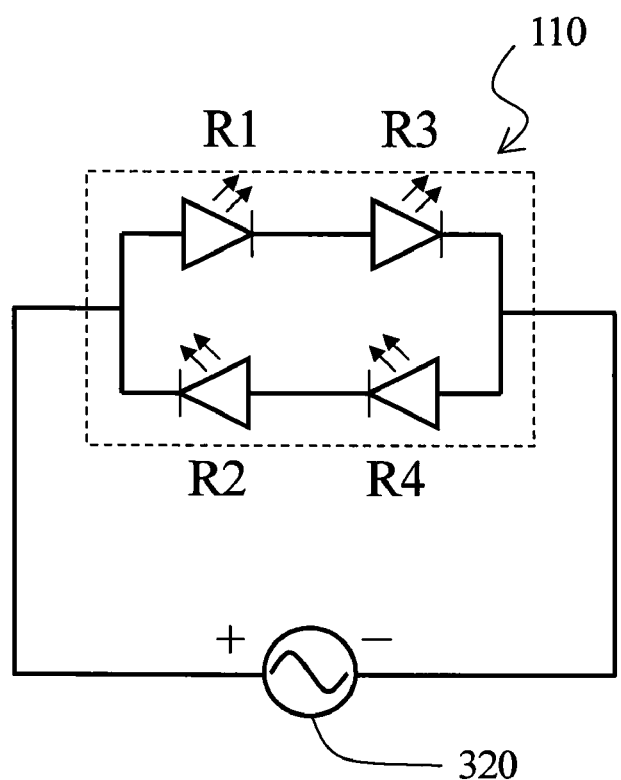
FIG. 3 illustrates the schematic diagram of the designed circuit and its waveform of the second embodiment in accordance with the present application.
Figure 3:
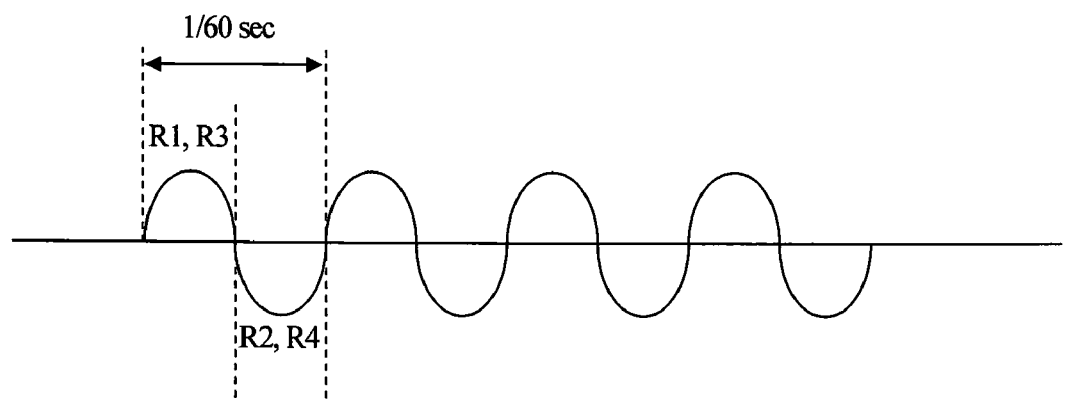

FIG. 1 shows a top view of a light-emitting diode chip 110, which comprises a 2×2 light-emitting array. The light-emitting diode chip 110 comprises four light-emitting units; a first light-emitting unit R1, a second light-emitting unit R2, a third light-emitting unit R3 and a fourth light-emitting unit R4. These four light-emitting units are connected by an electric circuit layer 118 but physically separated from each other and formed on a growth substrate 111. Wavelength conversion layers 117-1, 117-2, 117-3 and 117-4 are placed on the light-emitting units R1, R2, R3 and R4 respectively. FIG. 3 illustrates a representative circuit schematic diagram and the waveform of FIG. 1, wherein the connecting configuration for the electric circuit layer 118 to connect the light-emitting unit R1 and R3 is a serial connection; so does the configuration for the light-emitting units R2 and R4. The connecting configuration to connect the light-emitting units R1 and R3 and light-emitting units R2 and R4 is an anti-parallel connection, so both light-emitting units R1 and R3 and light-emitting units R2 and R4 are connected to one power supply, which can be an alternating current (AC) power source FIG. 2 shows the cross section view of FIG. 1 cutting along the dotted line AA'. The light-emitting units R1 and R3 are commonly formed on the growth substrate 111 and physically separated from each other by a trench. Each of the light-emitting units R1 and R3 comprises a first contact layer 112 epitaxially grown on the growth substrate 111; a light-emitting stack 113 which comprises a first cladding layer 1131 of a first-type conductivity, an active layer 1132, and a second cladding layer 1133 of a second-type conductivity epitaxially grown on the first contact layer 112 second contact layer 114 formed above the second cladding layer 1133; a first electrode 116 formed on the first contact layer 112; a second electrode 115 formed on a second contact layer 114; and a wavelength conversion layer 117-1 formed above the second contact layer 114 of the light-emitting unit R1, and a wavelength conversion layer 117-3 formed above a second contact layer 114 of the light-emitting unit R3. The electric circuit layer 118 extends from the first electrode 116 of the light-emitting unit R1 to the second electrode 115 of the light-emitting unit R3, therefore R1 and R3 are connected in serial. And as shown in FIG. 1, a second electrode 115 in the light-emitting unit R2 is connected by the electric circuit layer 118 to the first electrode 116 in the light-emitting unit R4; moreover, the electric circuit layer 118 further connects the second electrode 115 of the first light-emitting unit R1 and the first electrode 116 of the second light-emitting unit R2 to the positive pole of an alternating current (AC) power source. Same connection applied to the first electrode 116 of the light-emitting unit R3 and the second electrode 115 of the light-emitting unit R4 via the electric circuit layer 118 but tied with the negative pole of the AC power source. Therefore, the serial linked light-emitting units R1 and R3 are connected with the serial linked light-emitting units R2 and R4 in an anti-parallel configuration. In another embodiment, the light-emitting diode chip 110 further comprises an current spreading layer (not shown in the drawing) formed between the second contact layer 114 and the second electrode 115 to spread the current evenly on the surface of the light-emitting diode chip 110. The resistivity of the current spreading layer is lower than that of the second contact layer 114.

As shown in FIG. 2, the light-emitting diode chip 110 further comprises an insulation layer 119 formed along the side walls of the electric circuit layer 118 and the light-emitting units R1 and R3, and formed between the growth substrate 111 and the electric circuit layer 118, to avoid the short circuit between the light-emitting units R1 and R3 caused by the electric circuit layer 118. Each of the light-emitting units R1, R2, R3 and R4 has the similar structure, i.e. the same light-emitting film stack, such that they can emit a light with same spectrum. The wavelength conversion layer formed above each light-emitting unit can be various so each light-emitting unit can emit a light with a different wavelength per different arrangement. In the embodiments in the present disclosure, the wavelength conversion layer is directly spread on the surface of the second contact layer 114 and is incorporated as a part of the light-emitting diode chip 110, and the second electrode 115 protrudes the wavelength conversion layer. The wavelength conversion layers 117-1, 117-2,117-3 and 117-4 comprise at least one material selected from a group consisting of blue fluorescent powder, yellow fluorescent powder, green fluorescent power, red fluorescent powder, ZnSe, ZnCdSe, III-Phosphide, III-Arsenide, and III-Nitride. The function of the blue fluorescent powder is to convert the incident light beam into a blue light. Similarly for a yellow, green and red fluorescent powder. All the materials and the content of the fluorescent powder are in the related arts.

As illustrated in FIG. 3, a lighting apparatus 101 comprises a light-emitting diode chip 110 exemplified in FIGS. 1 and 2, and an alternating current (AC) power supply which is connected with the light-emitting diode chip 110. TABLE 1 shows the examples of different combinations of the light spectrum emitted from the light-emitting units R1~R4 and the corresponding wavelength conversion layer of each unit, 117-1 (for R1), 117-2 (for R2), 117-3 (for R3) and 117-4 (for R4); wherein the wavelength of the light emitted from R1~R4 is a UV light with a wavelength ranging between 410~430 nm or a blue light ranging between 440~480 nm. Therefore the light-emitting diode chip 110 can emit a white light mixed by different colors of lights, which are generated by the conversion made by the wavelength conversion layers 117-1~4 respectively.

TABLE 1

Examples of Combination of Different Wavelength Conversion Material

| R1~R4 | Wavelength Conversion Material | | | |
|---|---|---|---|---|
| Wavelength | 117-1 | 117-2 | 117-3 | 117-4 |
| Example 1 | 410~430 nm | Yellow | Red | Blue | Green |
| Example 2 | 410~430 nm | Green | Yellow | Blue | Green |
| Example 3 | 410~430 nm | Yellow | Green | Blue | Green |
| Example 4 | 410~430 nm | Red | Green | Blue | Green |
| Example 5 | 440~480 nm | Red | Green | — | Green |

Example 1 in TABLE 1 shows the material of the wavelength conversion layers 117-1~4 consisting of yellow, red, blue and green fluorescent powder respectively. During the positive half wave of the alternating current (AC) power source, the light-emitting unit R1 and the light-emitting unit R3 respectively emits a near UV light with wavelength approximately ranging between 410~430 nm. The near UV light from the light-emitting unit R1 is converted by the wavelength conversion layer 117-1 with yellow fluorescent powder and radiating a yellow light with wavelength ranging between 570~595 nm. The near UV light from the light-emitting unit R3 is converted by the wavelength conversion layer 117-3 with blue fluorescent powder and radiating a blue light with wavelength ranging between 440~480 nm. When the alternating current AC power source switch to the negative half wave, the light-emitting unit R2 and the light-emitting unit R4 respectively emits a near UV light with wavelength approximately ranging between 410~430 nm. The near UV light from the light-emitting unit R2 is converted by the wavelength conversion layer 117-2 with red fluorescent powder and radiating a red light with wavelength ranging between 600~650 nm. The near UV light from the light-emitting unit R4 is converted by the wavelength conversion layer 117-4 with green fluorescent powder and radiating a green light with wavelength ranging between 500~560 nm. The red and green lights generated during the negative half wave are mixed with the yellow and blue lights generated during the positive half wave; such that the light-emitting diode chip 110 emits a white light. For another embodiment in the present disclosure, the wavelength conversion layer can be formed optionally on the light-emitting units R1~R4 as Example 5 in TABLE 1. Because the light-emitting diode chip 110 radiates light by zones in accordance with the frequency of the alternating current (AC), and each of the wavelength conversion layers is only spread on the respective light-emitting unit, the loss of light intensity from unnecessary secondary conversion caused by different wavelength conversion layers can be reduced effectively. Wherein the frequency of the alternating current (AC) power is 60 Hz or its multiples.

Figure 4:
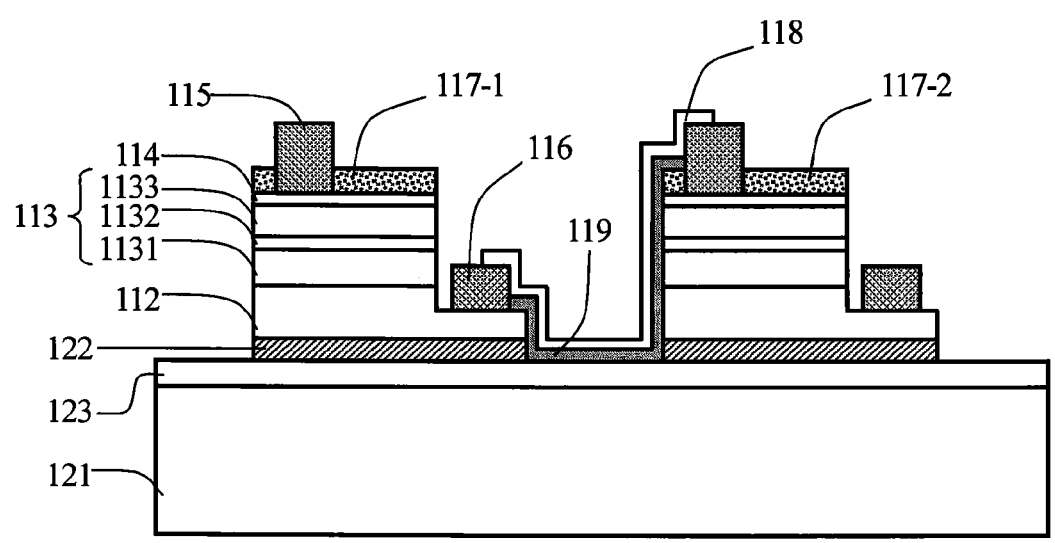
FIG. 4 is a cross section view of a light-emitting diode chip of the second embodiment in accordance with the present application.

To enhance the heat dissipation, the growth substrate 111 of the light-emitting diode chip 110 as shown in FIG. 2 can be removed and replaced by a supporting substrate 121 bonded with the first contact layer 112 via a non-single crystalline bonding layer 123 as the embodiment illustrated in FIG. 4. Moreover, if the supporting substrate 121 is not transparent, an anti-reflection layer 122 can be formed between the first contact layer 112 and the non-single crystalline bonding layer 123 to avoid the light emitted from the light-emitting diode being absorbed by the supporting substrate 121.

Figure 5:
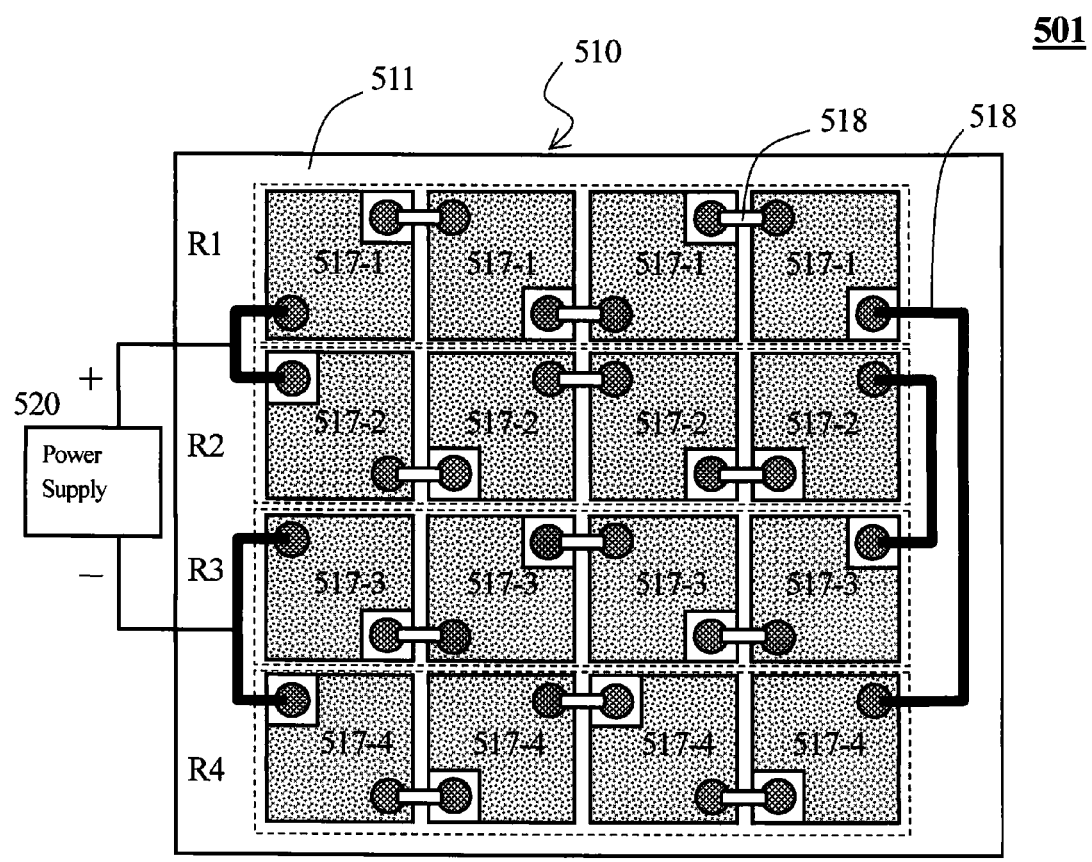
FIG. 5 is a top view of a light-emitting diode chip of the third embodiment in accordance with the present application.

FIG. 5 shows a light-emitting device 501 comprising a 4×4 array-type light-emitting diode chip 510 and a power source connected to two terminals of the light-emitting diode chip 510. The light-emitting diode chip 510 comprises a light-emitting unit R1, a light-emitting unit R2, a light-emitting unit R3, and a light-emitting unit R4, which are physically separated from each other and formed on a growth substrate 511; wherein the light-emitting units R1~R4 respectively represents a serially linked 1×4 light-emitting array and are electrically connected by an electric circuit layer 518 in a connecting configuration. Wavelength conversion layers 517-1, 517-2, 517-3 and 517-4 are formed respectively on the light-emitting units R1, R2, R3 and R4. Wherein the connecting configuration for the electric circuit layer 518 to connect the light-emitting unit R1 and R3 is a serial connection; so is the configuration for the light-emitting units R2 and R4. The connecting configuration to connect the light-emitting units R1 and R3 and light-emitting units R2 and R4 is an antiparallel connection, so both light-emitting units R1 and R3 and light-emitting units R2 and R4 are connected to two terminals of a power supply 520 which can be an alternating current (AC) power source. Because the light-emitting diode chip 510 radiates light by zones in accordance with the frequency of the alternating current (AC), and each wavelength conversion layer is only spread on the respective light-emitting unit, the loss of light intensity from unnecessary secondary conversion caused by different wavelength conversion layers can be reduced effectively.

The area of the light-emitting diode chip as described in all the embodiments in the present disclosure is smaller than 5 mm² or 2 mm² in order to be assembled in a package or formed on an electric circuit platform. A preferred size of the chip is to fit for current commercial or industrial standard specification, such as 12 mil×12 mil, 25 mil×25 mil, 45 mil×45 mil, or 55 mil×55 mil, etc.

Figure 6:
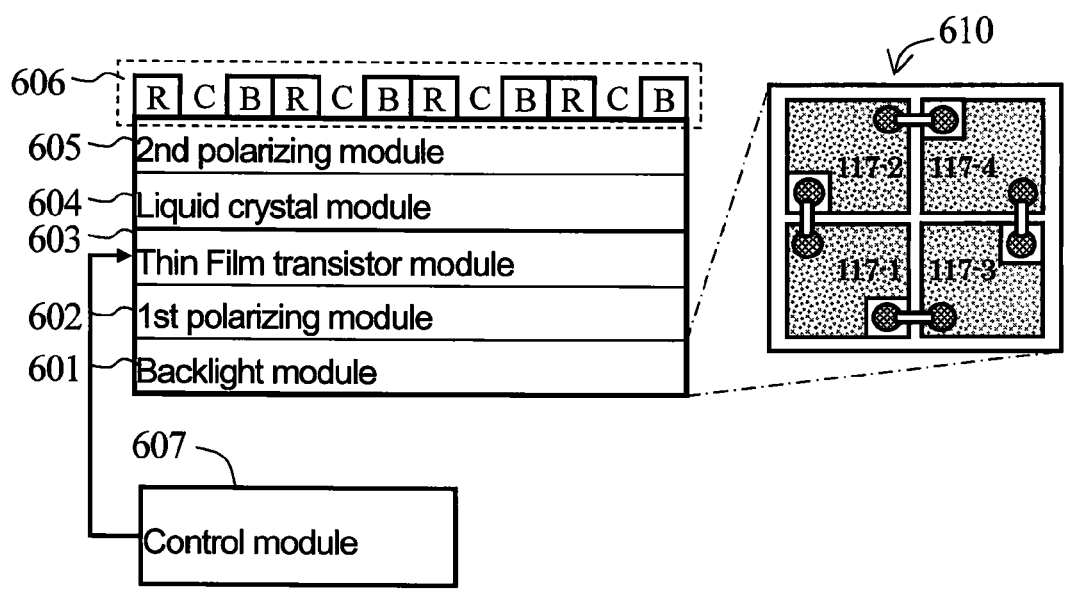
FIG. 6 illustrates an embodiment of a display apparatus in accordance with the present application.

FIG. 6 shows a display apparatus in the present disclosure. A display apparatus 600 with a plurality of pixels comprises a backlight module 601, a first polarizing module 602 formed above the backlight module 601, a thin film transistor module 603 formed above the first polarizing module 602, a liquid crystal display module 604 formed above the thin film transistor module 603, a second polarizing module 605 formed above the liquid crystal display module 604, a color filter module 606 formed above the second polarizing module 605 and a control module 607, which comprising an electrical control circuit to control the modules in the display apparatus 600. Wherein the backlight module 601 further comprises a light-emitting device 610 which provides the light source for the display apparatus 600. The light-emitting device 610 can be any type light-emitting source or the light-emitting diode chip 110 (see FIG. 1) as described in the embodiments in the present disclosure with the conversion layer 117-1~117-4 with different combinations as shown in TABLE 1. Exemplified by example 4 in TABLE 1, the materials of wavelength conversion layers, 17-1,117-2,117-3, and 117-4, respectively comprises red, green, blue and green fluorescent powder. When electric current from an alternating current (AC) power source is in positive half wave, the light-emitting unit R1 and the light-emitting unit R3 are driven to emit a near UV light with wavelength approximately ranging between 410~430 nm. Following the light emission from the light-emitting units R1 and R3, the near UV light is converted respectively by the wavelength conversion layer 117-1 formed on the light-emitting unit R1 with red fluorescent powder and the wavelength conversion layer 117-3 formed on the light-emitting unit R3 with blue fluorescent powder. Such that the light-emitting units R1 and R3 respectively emits a red light with wavelength ranging between 600~650 nm and a blue light with wavelength approximately ranging between 440~480 nm after the conversion.

When the AC power source switches to the negative half wave, the light-emitting unit R2 and the light-emitting unit R4 are driven to emit a near UV light with wavelength approximately ranging between 410~430 nm. Following the light emission from the light-emitting units R2 and R4, the near UV light is converted respectively by the wavelength conversion layer 117-2 formed on the light-emitting unit R2 with green fluorescent powder and the wavelength conversion layer 117-4 formed on the light-emitting unit R4 with green fluorescent powder. Such that the light-emitting units R3 and R4 respectively emits a green light with wavelength ranging between 500~560 nm after the conversion. The liquid crystal display module 604 comprises a plurality of liquid crystal segments respectively corresponding to the plurality of the pixels in the display apparatus 600. The color filter module 606 comprises a plurality of red color filter segments R for filtering out light beams except for red light with wavelength ranging between 600 to 650 nm, a plurality of blue color filter segments B for filtering out light beams except for blue light with wavelength ranging between 440 to 480 nm, and a plurality of transparent segments C which is transparent to visible lights; such that it does not function like color filters. Because the red, blue and green light emitted from the backlight module 601 alternates in accordance with the predetermined clock of the AC power source, the backlight module 601 emits red and blue lights when the driving AC current is in positive half wave, and through the red color filter segments R and the blue color filter segments B in the color filter module 606 to emit red and blue lights. When the AC current is in negative half wave, the backlight module 601 only emits green light and the display apparatus 600 emits green light directly through the transparent segments C without any formed green filter segments on the color filter module 606. Wherein the transparent segments C comprises a transparent material or a gap. The red color filter segments, R, blue color filter segments, B, and transparent segments C have substantially the same width, area and/or volume. For other parts shown in the display apparatus 600 and not mentioned or described in detail can be found in the related arts.

For all the embodiments in the present disclosure, materials used for the first contact layer, the first cladding layer, the second cladding layer, the second contact layer and the active layer comprises III-V compound, $Al_xIn_yGa_{(1-x-y)}N$, wherein $x \geq 0$, $y \leq 1$ and $(x+y) \leq 1$; x and y are both positive numbers. The dopant of the first cladding layer can be an n-type impurity, like Si, or a p-type impurity, like Mg or Zn. The dopant type of the second cladding layer is opposite to the type for the first cladding layer. The electric current spreading layer comprises transparent metal oxide, such as Indium Tin Oxide (ITO), metal, or metal alloy. The growth substrate comprises at least one material such as sapphire, silicon carbide, GaN and AlN. The supporting substrate comprises at least one material such as GaP, sapphire, SiC, GaN, and AlN. Materials for the supporting substrate may be also selected from a thermal conductive material group comprising diamond, DLC, ZnO, Au, Ag, Al, and other metals. Materials for the non-single crystalline bonding layer comprises at least one material selected from a group consisting of metal oxide, non-metal oxide, polymer, metal and metal alloy.

The foregoing description has been directed to the specific embodiments of this application. It will be apparent; however, that other variations and modifications may be made to the embodiments without escaping the spirit and scope of the application.

The invention claimed is:
1. A light-emitting device comprising:
a substrate;
a semiconductor light-emitting array formed above the substrate and emitting a first light with a first spectrum, wherein the semiconductor light-emitting array comprises a first light-emitting unit, a second light-emitting unit and a third light-emitting unit;

a first wavelength conversion layer formed above the first light-emitting unit and radiates a second light with a second spectrum excited by the first light;

a second wavelength conversion layer formed above the second light-emitting unit and emitting a third light with a third spectrum different from the second spectrum excited by the first light; and an electric circuit layer electrically connecting the first light-emitting unit, the second light-emitting unit and the third light-emitting unit in a connection fashion such that the first light-emitting unit and the second light-emitting unit emit light alternatively with a predetermined clock when driven by a power source, and such that the third light-emitting unit and the second light-emitting unit emit light alternatively with a predetermined clock when driven by the power source, wherein the third light-emitting unit radiates the first light with a first spectrum different from the second and third spectrums; wherein a third wavelength conversion layer is formed on the third light-emitting unit; and the third wavelength conversion layer emits a fourth light with a fourth spectrum different form the second and the third spectrums excited by the first light; and wherein the electric circuit layer electrically connects the first light-emitting unit with the third light-emitting unit in a serial configuration, and connects the first light-emitting unit and the second light-emitting unit in an anti-parallel configuration.

2. The light-emitting device of claim 1, wherein the light-emitting device has an area smaller than 5 mm$^2$.

3. The light-emitting device of claim 1, wherein the light-emitting device has an area smaller than 2 mm$^2$.

4. The light-emitting device of claim 1, wherein the first spectrum comprises a wavelength ranging between 410~430 nm or 440~480 nm.

5. The light-emitting device of claim 4, wherein the second spectrum comprises a wavelength range selected from a group consisting of 440~480 nm, 500~560 nm, 570~595 nm and 600~650 nm.

6. The light-emitting device of claim 4, wherein the third spectrum comprises a wavelength range selected from a group consisting of 440~480 nm, 500~560 nm, 570~595 nm and 600~650 nm.

7. The light-emitting device of claim 1, wherein the connection fashion comprises an anti-parallel configuration.

8. The light-emitting device of claim 1, wherein the power source is an alternating current (AC) power source.

9. The light-emitting device of claim 1, wherein the fourth spectrum comprises a wavelength range selected from a group consisting of 440~480 nm, 500~560 nm, 570~595 nm and 600~650 nm.

10. The light-emitting device of claim 1, wherein the substrate comprises a single crystalline structure and the semiconductor light-emitting array comprises an epitaxial nitride structure grown epitaxially on the substrate.

11. The light-emitting device of claim 1, further comprising a non-single crystalline bonding layer between the substrate and the semiconductor light-emitting array.

12. The light-emitting device of claim 11, wherein the non-single crystalline bonding layer comprises at least one material selected from a group consisting of metal, organic compound, metal oxide, and non-metal oxide.

13. The light-emitting device of claim 1, further comprising a reflection layer between the substrate and the semiconductor light-emitting array.

14. The light-emitting device of claim 1, wherein the first light-emitting unit and the second light-emitting unit are physically separated by a trench.

15. The light-emitting device of claim 1, wherein the first light-emitting unit and the second light-emitting unit are physically insulated from the substrate.

16. The light-emitting device of claim 1, wherein the material for the first wavelength conversion layer and the second wavelength conversion layer are layer-structured formed on the first light-emitting unit and the second light-emitting unit correspondingly; and the first light-emitting unit and the second light-emitting unit are separated by a trench.

17. A light-emitting device for use in a display apparatus with a plurality of pixels, the display apparatus at least comprising a backlight module including the light-emitting device, a liquid crystal module, and a color filter module, the light-emitting device comprising:

a substrate;

a semiconductor light-emitting array formed above the substrate and emitting a first light with a first spectrum, wherein the semiconductor light-emitting array comprises a first light-emitting unit, a second light-emitting unit and a third light-emitting unit;

a first wavelength conversion layer formed above the first light-emitting unit and radiates a second light with a second spectrum excited by the first light;

a second wavelength conversion layer formed above the second light-emitting unit and emitting a third light with a third spectrum different from the second spectrum excited by the first light; and a connecting layer electrically connecting the first light-emitting unit, the second light-emitting and the third light-emitting unit in a connection fashion such that the first light-emitting unit and the second light-emitting unit emitting light alternatively under a predetermined clock when driven by a power source, and such that the third light-emitting unit and the second light-emitting unit emit light alternatively with a predetermined clock when driven by the power source, wherein the third light-emitting unit radiates the first light with the first spectrum different from the second and third spectrums; wherein a third wavelength conversion layer is formed on the third light-emitting unit; and the third wavelength conversion layer emits a fourth light with a fourth spectrum different form the second and the third spectrums excited by the first light; and wherein the connecting layer electrically connects the first light-emitting unit with the third light-emitting unit in a serial configuration, and connects the first light-emitting unit and the second light-emitting unit in an anti-parallel configuration.

* * * * *